(12) United States Patent
Choi et al.

(10) Patent No.: US 8,697,317 B2
(45) Date of Patent: Apr. 15, 2014

(54) EXPOSURE APPARATUS FOR FORMING A RETICLE AND METHOD OF FORMING A RETICLE USING THE SAME

(75) Inventors: Jin Choi, Yongin-si (KR); Jin-Ha Jeong, Yongin-si (KR); Urazaev Vladimir, Suwon-si (KR); Hea-Yun Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/564,196

(22) Filed: Aug. 1, 2012

(65) Prior Publication Data

US 2013/0052569 A1 Feb. 28, 2013

(30) Foreign Application Priority Data

Aug. 25, 2011 (KR) .................. 10-2011-0085039

(51) Int. Cl.
  *G03F 1/20* (2012.01)
(52) U.S. Cl.
  CPC ............... *G03F 1/20* (2013.01); *Y10S 430/143* (2013.01)
  USPC ............... 430/5; 430/296; 430/394; 430/396; 430/942
(58) Field of Classification Search
  CPC ........................................................ G03F 1/20
  USPC ...................... 430/5, 296, 320, 394, 396, 942
  See application file for complete search history.

(56) References Cited

U.S. PATENT DOCUMENTS 7,714,308 B2 5/2010 Hiroshima

FOREIGN PATENT DOCUMENTS

| JP | 2000-058424 | 2/2000 |
| JP | 2008-066441 | 3/2008 |
| KR | 10-2009-0072807 A | 7/2009 |

*Primary Examiner* — Christopher Young
(74) *Attorney, Agent, or Firm* — Lee & Morse, P.C.

(57) ABSTRACT

A method including loading a blank reticle; projecting an electron beam; moving a second aperture plate having a first and second pattern aperture so the first pattern aperture is overlapped by a first aperture of a first aperture plate, the electron beam passing through the first pattern aperture after passing the first aperture; exposing the blank reticle with the electron beam that passes the first pattern aperture to form a first exposure pattern; moving the second aperture plate so the second pattern aperture is overlapped by the first aperture of the first aperture plate, the electron beam passing through the second pattern aperture after passing the first aperture; exposing the blank reticle with the electron beam after passing the second pattern aperture, to form a second exposure pattern; and developing the blank reticle having the first and second exposure patterns to form the reticle having first and second patterns.

15 Claims, 11 Drawing Sheets

EXPOSURE APPARATUS FOR FORMING A RETICLE AND METHOD OF FORMING A RETICLE USING THE SAME

CROSS-REFERENCE TO RELATED APPLICATION

This application claims priority under 35 USC §119 to Korean Patent Application No. 10-2011-0085039 filed on Aug. 25, 2011 in the Korean Intellectual Property Office (KIPO), the entire disclosure of which is incorporated herein by reference.

BACKGROUND

1. Field

Example embodiments relate to an exposure apparatus for forming a reticle and a method of forming a reticle using the same.

2. Description of the Related Art

In a photolithography process for forming a semiconductor device, an exposure apparatus may project a pattern of a reticle onto a substrate. The reticle may have various types of patterns, and may be formed by patterning layers on a quartz plate.

SUMMARY

One or more embodiments may provide a method of forming a reticle, including: loading a blank reticle; projecting an electron beam; moving a second aperture plate having a first pattern aperture and a second pattern aperture so that the first pattern aperture is directly overlapped by a first aperture of a first aperture plate, the electron beam passing through the first pattern aperture after passing the first aperture; exposing the blank reticle with the electron beam after the electron beam passes the first pattern aperture, to form a first exposure pattern; moving the second aperture plate so that the second pattern aperture is directly overlapped by the first aperture of the first aperture plate, the electron beam passing through the second pattern aperture after passing the first aperture; exposing the blank reticle with the electron beam after the electron beam passes the second pattern aperture, to form a second exposure pattern; and developing the blank reticle having the first and second exposure patterns to form the reticle having first and second patterns.

The blank reticle may include a base plate, a blackout film and a photosensitive film sequentially stacked. Exposing the blank reticle may include exposing the photosensitive film, and developing the blank reticle may include developing the photosensitive film. Developing the blank reticle may include forming first and second masks in the photosensitive film. The method may further include etching the blackout film using the first and second masks as an etching mask to form the first and second patterns.

The second aperture plate may include a plurality of pattern apertures, each of the pattern apertures having different shapes. The second aperture plate may be moved by rotation. The plurality of second pattern apertures may be substantially a same distance from a center of the second aperture plate. Each of the first and second exposure patterns may be formed by one shot.

The method may further include: moving the second aperture plate so that a third aperture in the second aperture plate is directly overlapped by the first aperture; a portion of the electron beam passing through the third pattern aperture after passing the first aperture; and exposing the blank reticle using the electron beam after the electron beam passes the third pattern aperture, to form a plurality of third exposure patterns having irregular shapes.

An exposure apparatus may include: an electron gun for projecting an electron beam; a first aperture plate having a first aperture, the first aperture being configured to allow at least a portion of the electron beam to pass therethrough; a second aperture plate having a plurality of pattern apertures, the second aperture plate being moveable for positioning any one of the plurality of second apertures in overlapping relation with the first aperture; a plate holder for supporting the second aperture plate; and a driving part for moving the plate holder, the second aperture plate being moved according to the movement of the plate holder. The driving part may rotate the plate holder. The driving part may move the plate holder in a straight line. The driving part may move the plate holder within a plane in which the plate holder lies. The second aperture plate may have one of a circular shape, a ring-type shape, and a polygonal shape.

One or more embodiments may provide a method of forming a reticle, the method including: loading a blank reticle; projecting an electron beam toward the blank reticle; passing a first portion of the electron beam through a first aperture plate having a first aperture and a second aperture plate having a first pattern aperture and a second pattern aperture by aligning the first pattern aperture with the first aperture; exposing the blank reticle after the first portion of the electron beam passes the first pattern aperture, to form a first exposure pattern; passing a second portion of the electron beam through the first aperture plate and the second aperture plate by aligning the second pattern aperture with the first aperture; exposing the blank reticle after the second portion of the electron beam passes the second pattern aperture, to form a second exposure pattern; and developing the blank reticle having the first and second exposure patterns to form the reticle having first and second patterns. The second aperture plate may be rectangular. The first pattern aperture and the second pattern aperture are arranged in a single line. The second aperture plate may be circular. The first pattern aperture and the second pattern aperture may be arranged in a circle.

BRIEF DESCRIPTION OF THE DRAWINGS

Features will become apparent to those of ordinary skill in the art by describing in detail exemplary embodiments with reference to the attached drawings in which.

DETAILED DESCRIPTION

Korean Patent Application No. 10-2011-0085039, filed on Aug. 25, 2011, in the Korean Intellectual Property Office (KIPO), and entitled: "Exposure Apparatus for Forming a Reticle and Method of Forming a Reticle Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Also, when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 1:
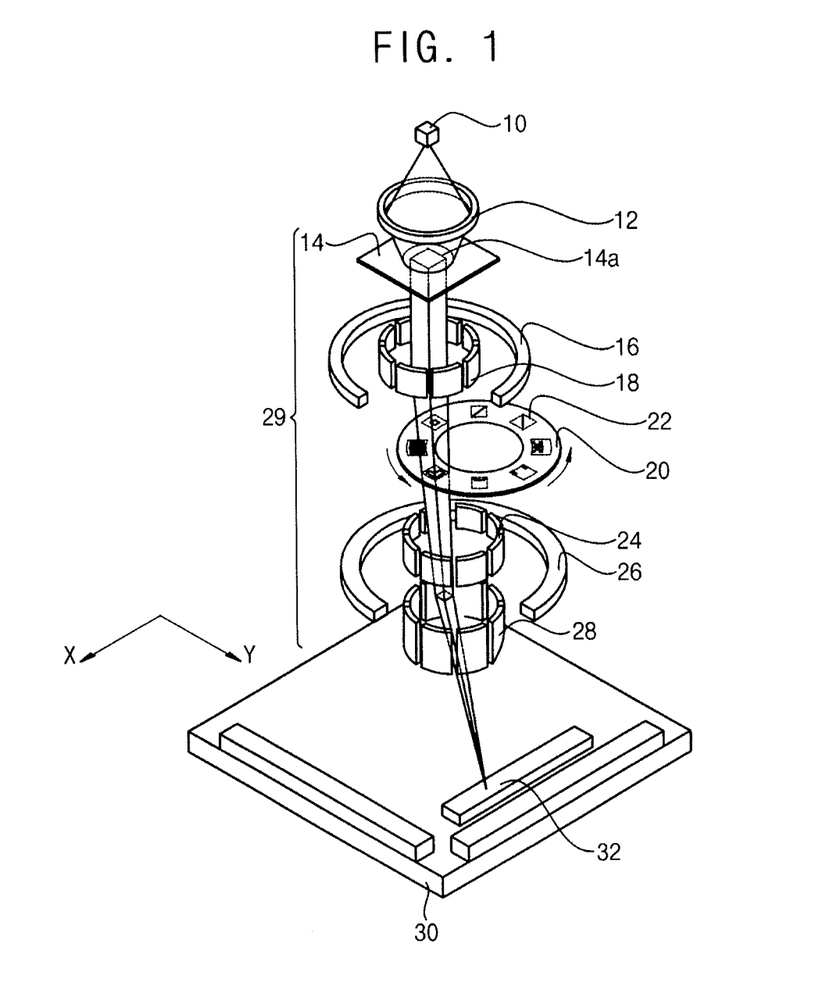
FIG. 1 illustrates an exposure apparatus for forming a reticle in accordance with example embodiments.

FIG. 1 illustrates an exposure apparatus for forming a reticle in accordance with example embodiments. The reticle may be defined to include a blank reticle and patterns thereon.

Referring to FIG. 1, the exposure apparatus may include an electron gun 10, an electron beam induction part 29 and a stage 30. The electron gun 10 may project an electron beam. The electron beam induction part 29 may induce the electron beam projected from the electron beam gun 10 onto a surface of a blank reticle 32. The stage 30 may support the blank reticle 32 thereon.

The electron gun 10 may project an electron beam having a given cross-sectional area. The electron gun 10 may project the electron beam for a given period. The electron gun 10 may project an electron beam during a projection period so that an exposure pattern may be formed on the blank reticle 32.

The electron beam induction part 29 may include a deflector, a plurality of lenses, aperture plates, a plurality of reflectors, and the like. The electron beam induction part 29 may change a shape of an electron beam, control a path of the electron beam, and/or focus the electron beam. In an example embodiment, the electron beam induction part 29 may include a condenser lens 12, a first aperture plate 14, a projector lens 16, a shaping reflector 18, a second aperture plate 20, a sub-reflector 24, an objective lens 26, and a main reflector 28.

The condenser lens 12 may focus an electron beam projected from the electron gun 10.

The first aperture plate 14 may partially block the electron beam focused by the condenser lens 12 so that a portion of the electron beam may penetrate the first aperture plate 14. A first aperture 14a of the first aperture plate 14 may have a rectangular shape from a plan view. The first aperture 14a may have a cross-sectional area smaller than that of the electron beam focused by the condenser lens 12. Thus, only a portion of the electron beam may penetrate the first aperture plate 14 through the first aperture 14a.

The projector lens 16 and the shaping reflector 18 may control a path of the electron beam by deflecting the electron beam.

The second aperture plate 20 may partially block the electron beam having penetrated the first aperture plate 14 through the first aperture 14a so that a portion of the electron beam may penetrate the second aperture plate 20. The second aperture plate 20 may have a plurality of second apertures 22, which may have various shapes from a plan view, e.g., each of the second apertures may have a different shape. Accordingly, the second apertures 22 may include, for example, a first pattern aperture having a first shape, a second pattern aperture having a second shape that is different from the first shape, a third pattern aperture having a third shape that is different from the first and second shapes, and so forth. The second apertures 22 may have any suitable shape, e.g., circular, ring-type, polygonal shapes, from a plan view. In example embodiments, the second apertures 22 may be defined around a center of the second aperture plate 20, e.g., along a circumferential edge of the second aperture plate 20, and substantially a same distance from the center of the second aperture plate 20.

FIGS. 3A to 3D illustrate plan views of the second aperture plate 20 in accordance with example embodiments.

Figure 3A:
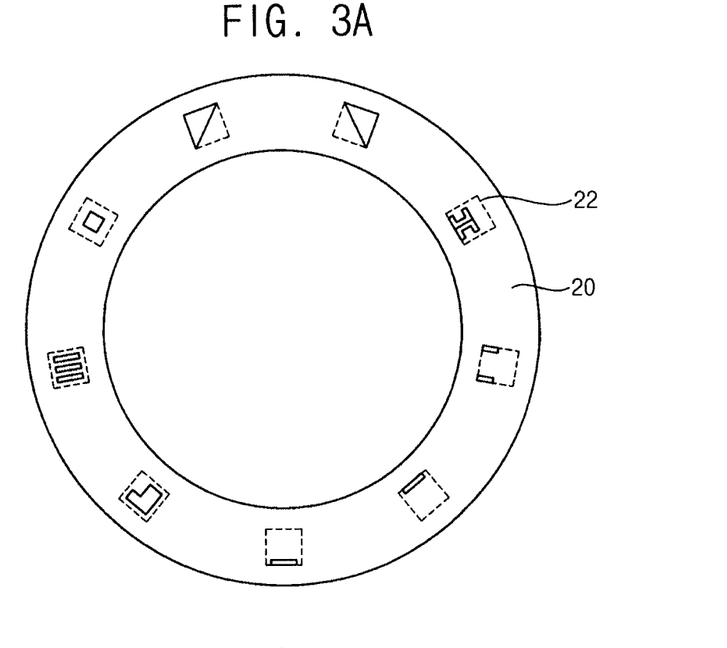
FIGS. 3A to 3D illustrate plan views of a second aperture plate in accordance with example embodiments.

Referring to FIG. 3A, the second aperture plate 20 may have a ring shape and a flat top surface. The second apertures 22 may be defined along a circumferential edge of the second aperture plate 20, and substantially a same distance from the center of the second aperture plate 20. The second apertures 22 may form a circular pattern, e.g., may be arranged in a circle around the center of the second aperture plate 20.

Figure 3B:
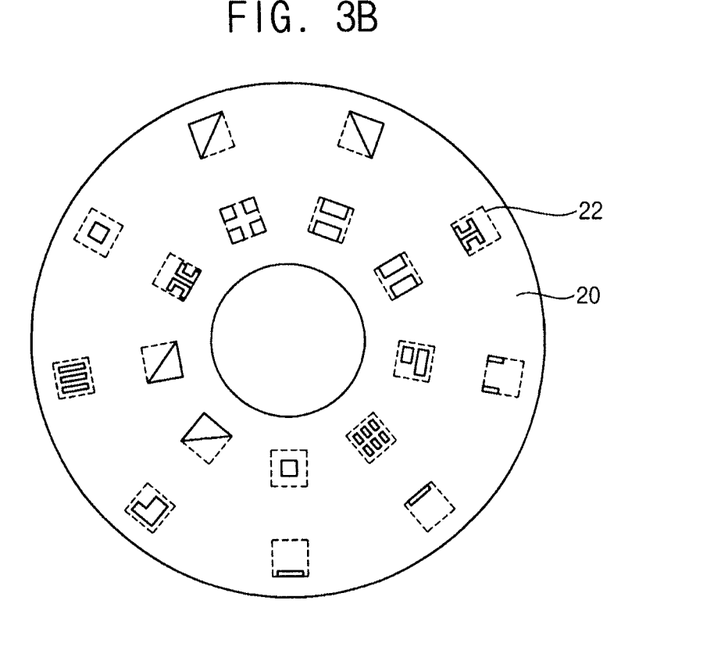

Referring to FIG. 3B, the second aperture plate 20 may have a ring shape and a flat top surface. The second apertures 22 may form a plurality of circular patterns. The second apertures 22 of each circular pattern may be substantially a same distance from a center of the second aperture plate 20.

Figure 3C:
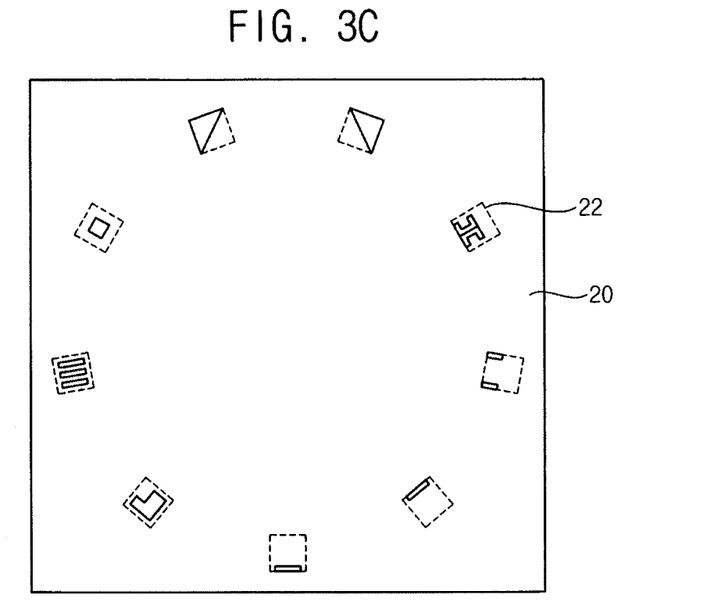

Referring to FIG. 3C, the second aperture plate 20 may have a rectangular shape and a flat top surface. The second apertures 22 may be substantially a same distance from a center of the second aperture plate 20. The second apertures 22 may form a circular pattern, e.g., may be arranged in a circle.

Figure 3D:
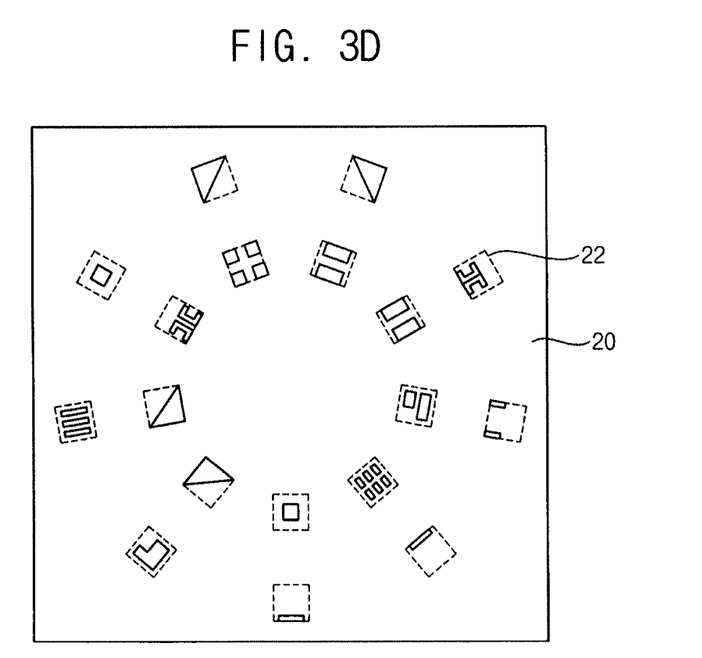

Referring to FIG. 3D, the second aperture plate 20 may have a rectangular shape and a flat top surface. The second apertures 22 may form a plurality of circular patterns. The second apertures 22 of each circular pattern may be substantially a same distance from a center of the second aperture plate 20.

A plate holder (not shown) may support the second aperture plate 20. The plate holder may be connected to a driving part (not shown) to be rotated.

Figure 2:
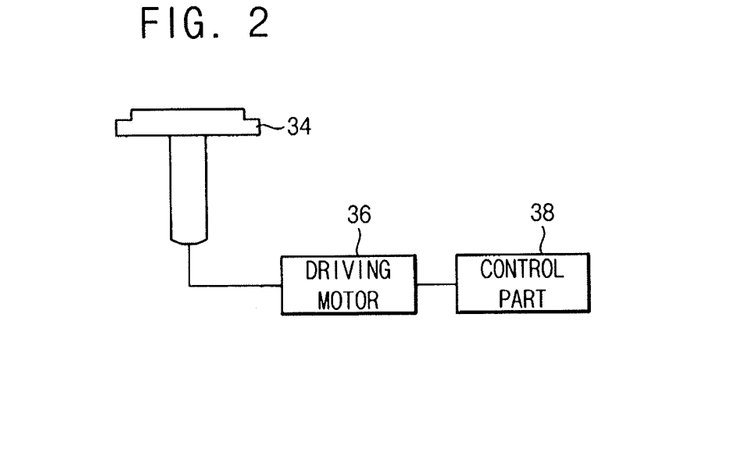
FIG. 2 illustrates a block diagram of a plate holder, a driving motor and a control part included in the exposure apparatus of FIG. 1.

FIG. 2 illustrates a block diagram of a plate holder 34, a driving motor 36 and a control part 38 included in the exposure apparatus of FIG. 1.

Referring to FIG. 2, the plate holder 34 may be connected to the driving motor 36 that may be connected to a control part 38. The plate holder 34 may be rotated by the driving motor 36. As the plate holder 34 rotates, the second aperture plate 20, supported by the plate holder 34, may also rotate.

When the second aperture plate 20 rotates, at least one of the second apertures 22 may directly overlap the first aperture 14a. The second aperture plate 20 may be rotated so that at least one of the second apertures 22 may directly overlap the first aperture 14a. As such, the electron beam, having penetrated the first aperture 14a, may be incident upon at least one of the second apertures 22 without changing a beam axis thereof. Accordingly, the beam may not have an aberration so that it may be regularly incident upon the blank reticle 32, e.g., without deflection of the beam. The electron beam incident on the blank reticle 32 may have a regular profile. As such, a beam calibration in the exposure process may not be needed or a period for the beam calibration may be lengthened. Thus, a process time for exposure on the blank reticle 32 may be shortened.

As mentioned above, the second apertures 22 may have various shapes. For example, each of the second apertures 22 may have a different shape. The second aperture plate 20 may be rotated so that the first aperture 14a directly overlaps any one of the second apertures 22. Accordingly, a specific exposure pattern may be formed by one exposure using the second apertures 22.

The sub-reflector 24 and the main reflector 28 may control a path of the electron beam having passed by the second aperture 22. The electron beam may be focused a final time by the objective lens 26. After the final focus of the electron beam, the electron beam may be projected on the blank reticle 32 supported by the stage 30.

According to example embodiments, semiconductor circuit patterns having various shapes may be formed on the blank reticle 32 by projecting an electron beam using the exposure apparatus. Additionally, unlike a variable shaped beam (VSB) generally having one rectangular shaped aperture, the exposure apparatus may select various shaped second apertures 22 so that more complex patterns may be formed on the blank reticle 32 by one shot, e.g., one exposure. Thus, an exposure pattern that may be formed by several shots using the VSB exposure apparatus may be formed by one shot using the exposure apparatus in accordance with example embodiments.

Figure 4:
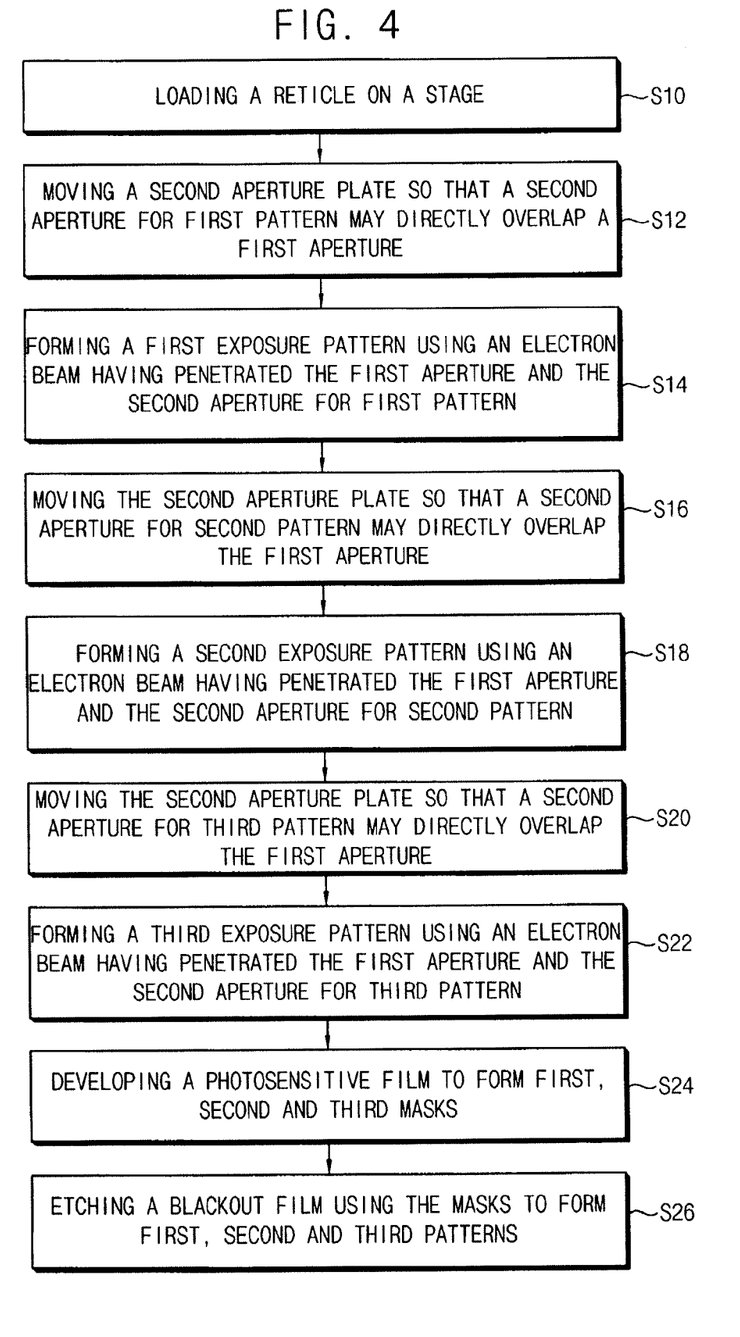
FIG. 4 illustrates a flow chart of a method of forming a reticle in accordance with example embodiments.
Figure 5:
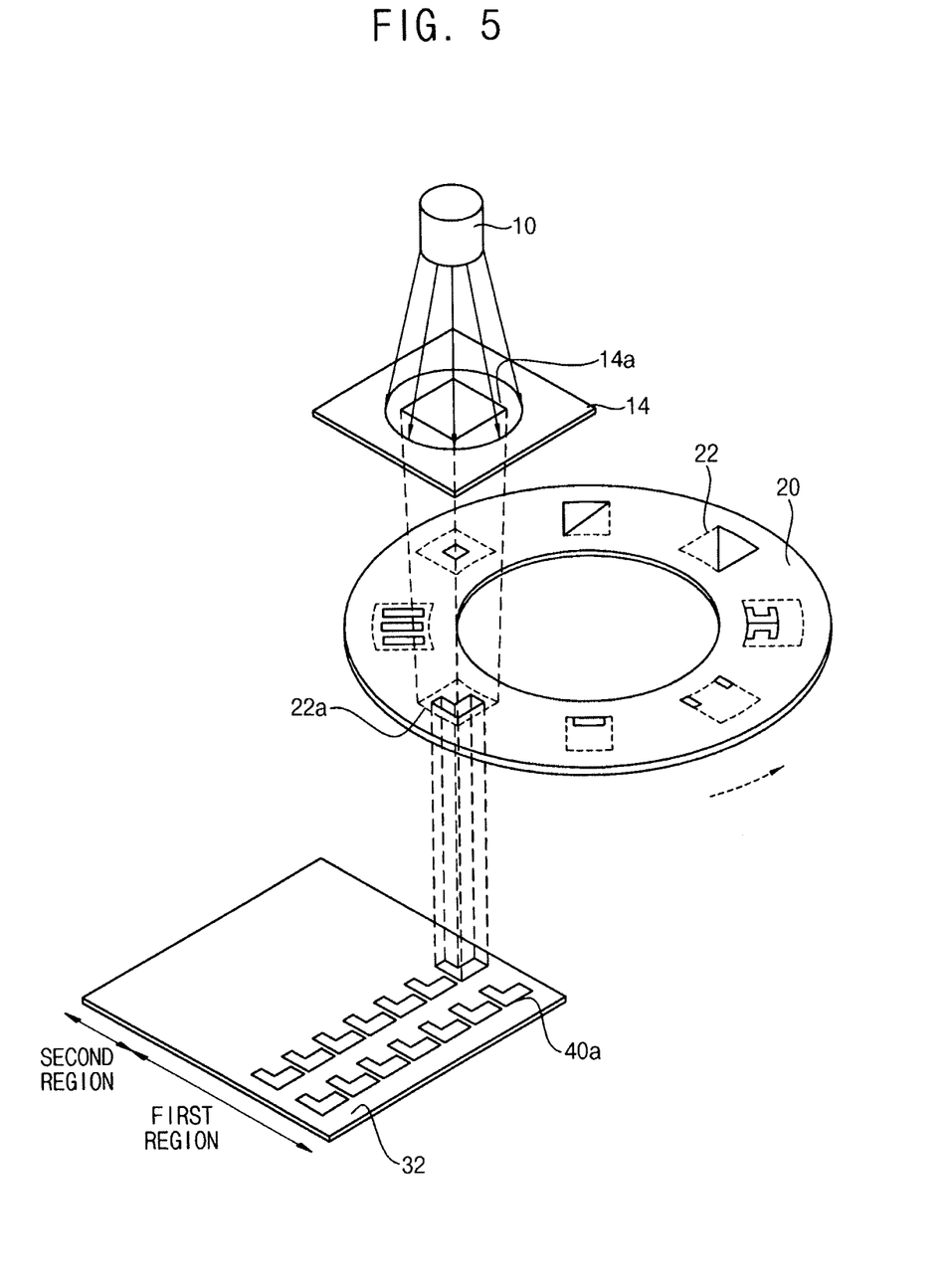
FIGS. 5 to 7 illustrate perspective views of stages in a method of forming the reticle in accordance with example embodiments.
Figure 6:
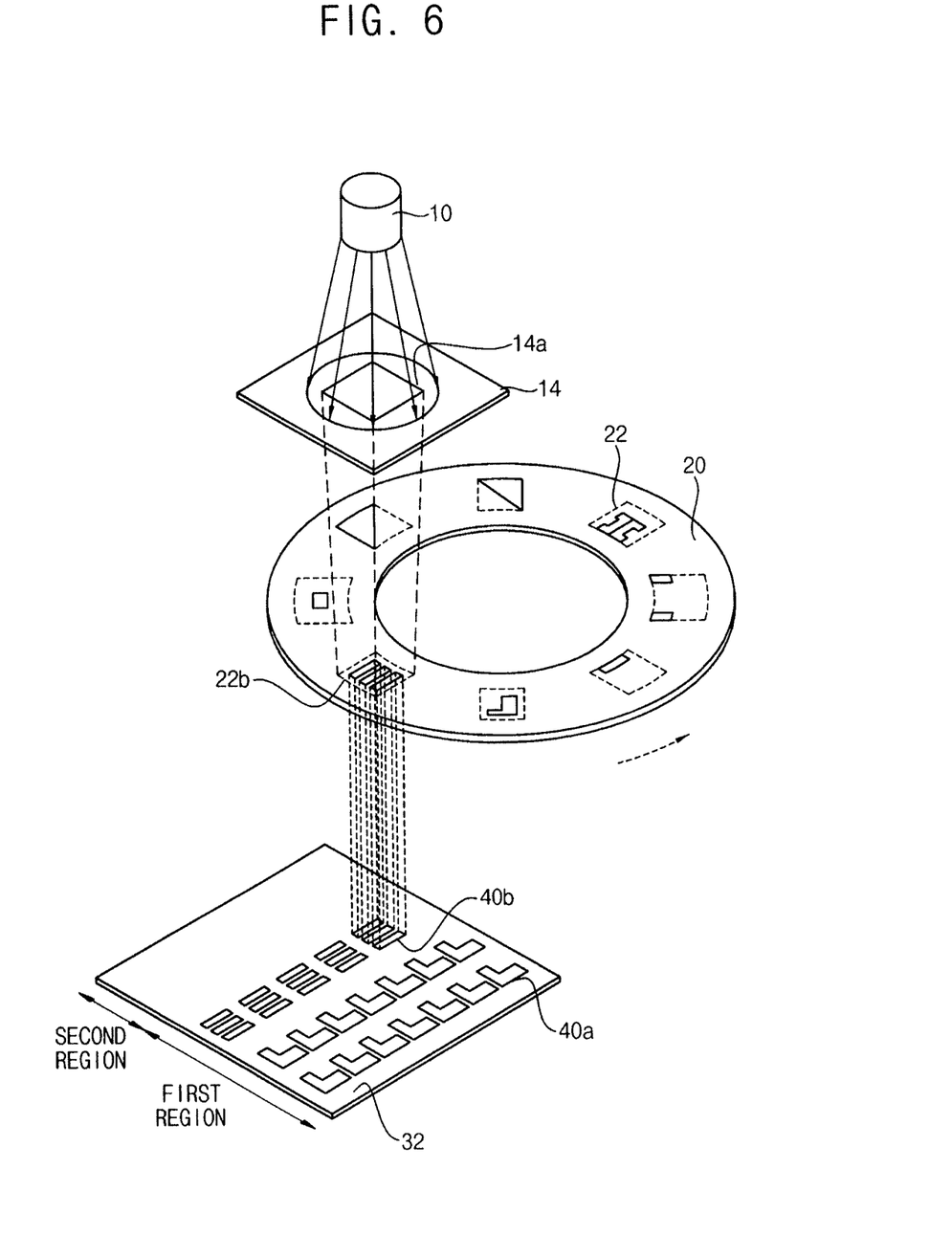
Figure 7:
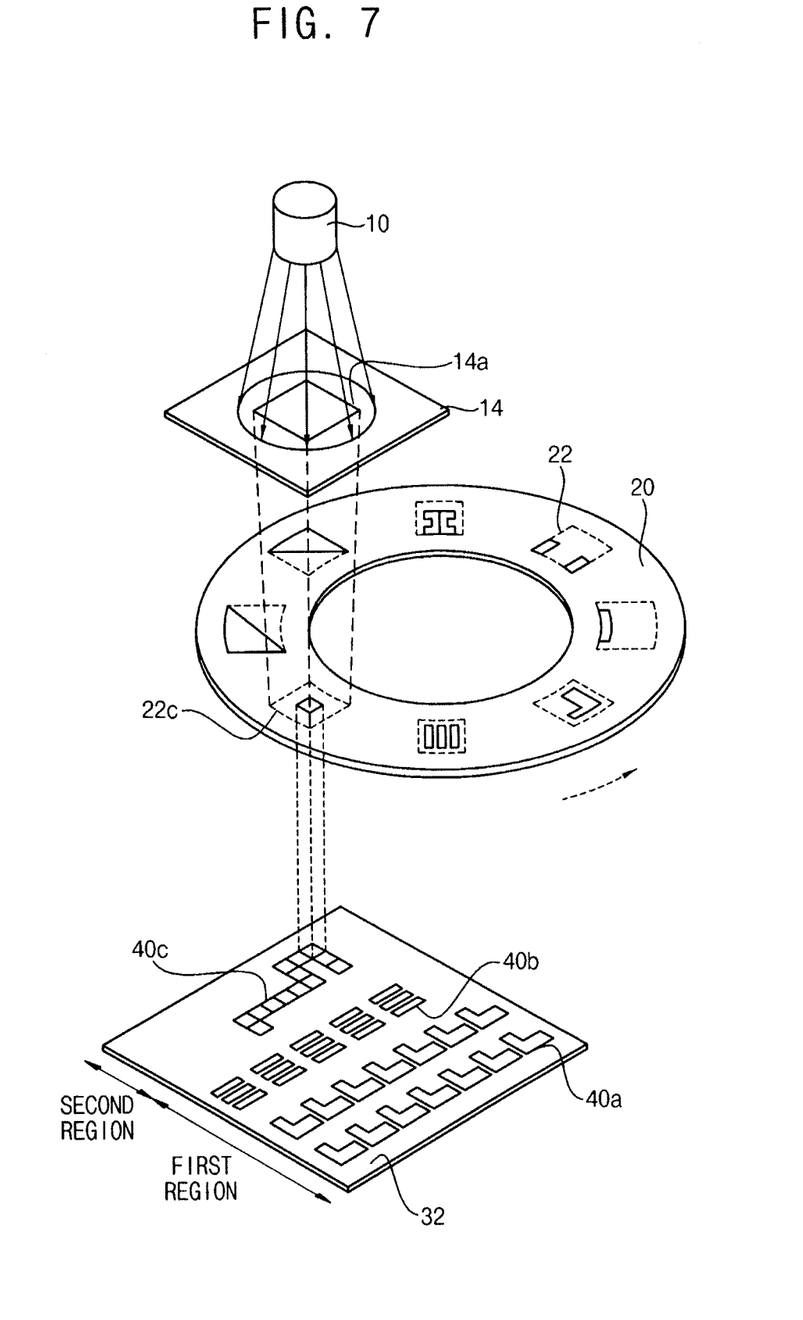

FIG. 4 illustrates a flow chart of a method of forming a reticle in accordance with example embodiments. FIGS. 5 to 7 illustrate perspective views of stages in the method of forming the reticle in accordance with example embodiments.

The reticle formed herein may include a first region in which a plurality of regular patterns may be formed and a second region in which a plurality irregular patterns may be formed. For example, the regular patterns may be patterns for forming memory cells, and the irregular patterns may be patterns for forming peripheral circuit patterns. According to one or more embodiments, the first region may have first and second patterns repeatedly arranged therein, and the second region may have third patterns therein.

Referring to FIGS. 1 and 4, a blackout film (not shown) may be formed on a base plate including quartz. The blackout film may include, e.g., chromium. A photosensitive film (not shown) may be further formed on the blackout film. A structure including the base plate, the blackout film and the photosensitive film sequentially stacked may be defined as a blank reticle 32.

In step S10, the blank reticle 32 may be loaded onto the stage 30 of the exposure apparatus.

Referring to FIG. 5 and step S12 in FIG. 4, the second aperture plate 20 may be moved so that the first aperture 14a may directly overlap a second aperture 22a for a first pattern (first pattern aperture), without changing a beam axis of an electron beam that has passed the first aperture 14a. The electron beam having passed the first aperture 14a may not be deflected to penetrate the second aperture 22a for the first pattern. As such, the second aperture plate 20 having the second aperture 22a for the first pattern may be moved so that the electron beam may penetrate the second aperture 22a for first pattern with no change of the beam axis thereof.

The movement of the second aperture plate 20 may be, e.g., a rotation, a first-dimensional movement, e.g., one directional movement, or a second-dimensional movement, e.g., two directional movement, and the like. In the present embodiment, the second aperture plate 20 may rotate.

For example, the second aperture plate 20 may be rotated so that the second aperture 22a for the first pattern may be placed at a position by which an electron beam having penetrating the first aperture 14a may pass with no change of the beam axis of the electron beam. The electron beam having passed through the second aperture 22a for the first pattern may be projected onto the blackout film of the blank reticle 32.

In step S14, the blank reticle 32 may be moved in a horizontal direction and the electron beam may be repeatedly projected to various positions of the blank reticle 32 via the first aperture 14a and the second aperture 22a for the first pattern. Thus, a plurality of first exposure patterns 40a may be formed in the first region of the blank reticle 32.

Referring to FIG. 6 and step 16 in FIG. 4, after forming the first exposure patterns 40a, the second aperture plate 20 may be rotated so that a second aperture 22b for a second pattern (second pattern aperture) may be placed at a position through which an electron beam having penetrated the first aperture 14a may pass, with no change of the beam axis of the electron beam in step S16.

In step S18, the blank reticle 32 may be moved in a horizontal direction and the electron beam may be repeatedly projected to various positions of the blank reticle 32 via the first aperture 14a and the second aperture 22b for the second pattern. Thus, a plurality of second exposure patterns 40b may be formed in the first region of the blank reticle 32.

By the above processes, regular patterns may be formed in the first region of the blank reticle 32. Shapes of the regular patterns may be different from each other according to process steps for manufacturing a semiconductor device, and one or more of the second apertures 22 may be selected to be used for forming patterns.

Referring to FIG. 7 and step S20 in FIG. 4, the second aperture plate 20 may be rotated so that a second aperture 22c for a third pattern (third pattern aperture), may be placed at a position by which an electron beam having penetrated the first aperture 14a may pass with no change of the beam axis of the electron beam. The third pattern aperture may have a rectangular shape. In step S22, the blank reticle 32 may be moved in a horizontal direction and the electron beam may be repeatedly projected to various positions of the blank reticle 32 via the first aperture 14a and the second aperture 22c for the third pattern. Thus, a plurality of third exposure patterns 40c may be formed in the second region of the blank reticle 32.

In step S24, the photosensitive film of the blank reticle 32 may be developed to form first, second and third masks.

The blackout film may be etched using the masks as an etching mask to form the first, second and third patterns for forming circuit. Thus, the reticle, including the patterns on the base plate, may be formed.

As illustrated above, various patterns for the reticle may be achieved by selecting various ones of the second apertures 22. Thus, the amount of exposing and the time for exposing may be reduced. Additionally, the beam axis may not be changed so that the aberration of the electron beam may not occur.

Figure 8:
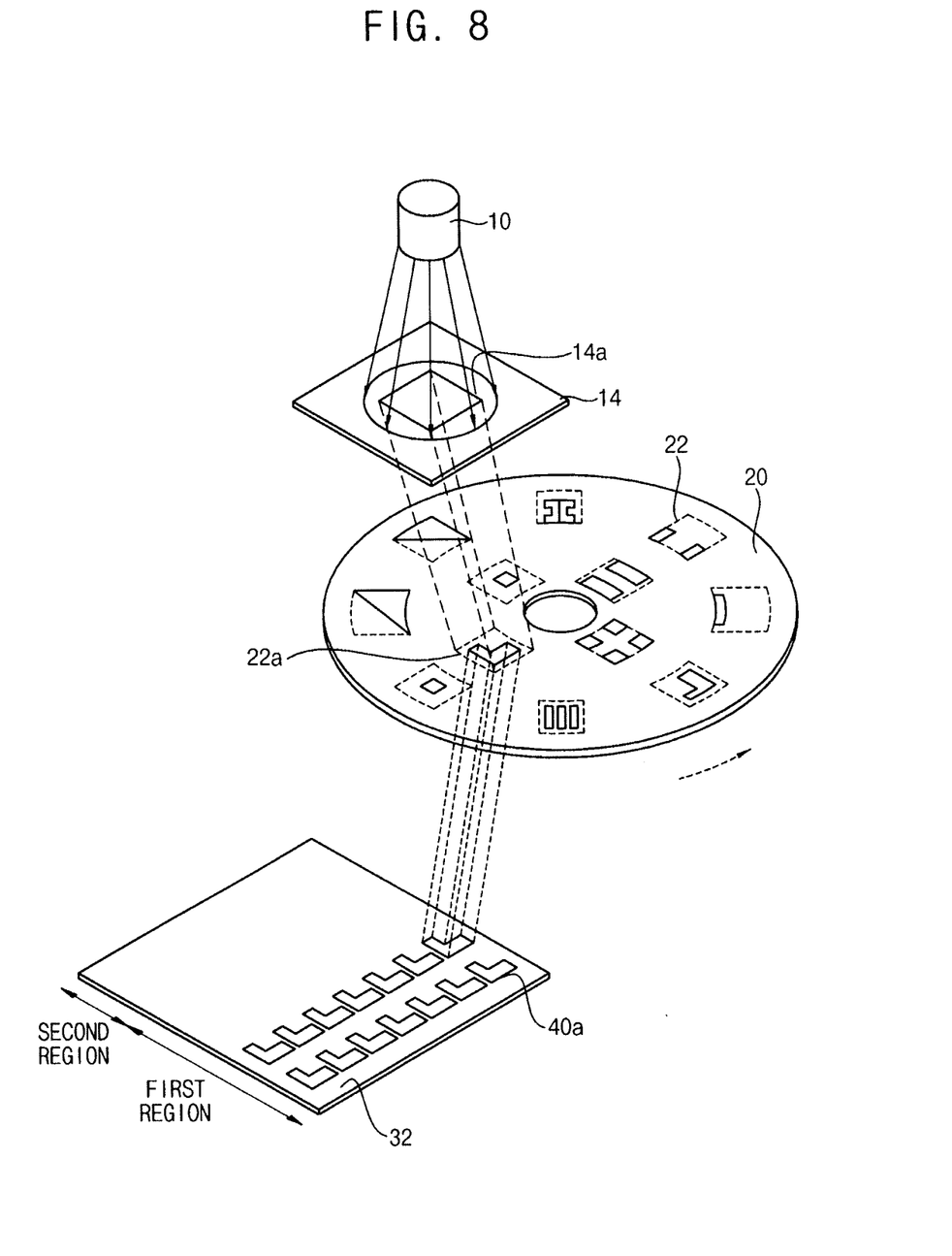
FIG. 8 illustrates a perspective view of stages in the method of forming a reticle in accordance with example embodiments.

FIG. 8 illustrates a perspective view of stages in a method of forming a reticle in accordance with example embodiments.

The method may be substantially the same as the method illustrated with reference to FIGS. 1 to 7, except that an electron beam having passed the first aperture may be deflected to be incident a second aperture plate.

Referring to FIG. 8, a second aperture plate 20 may include the second apertures 22, which form a first circular pattern, and second apertures 22a for a first pattern, which form a second circular pattern, e.g., within the first circular pattern. The second aperture plate 20 may be rotated to allow an electron beam that has penetrated a first aperture 14a to pass through the second aperture 22a. Unlike the second apertures 22, which may be rotated to directly overlap the first aperture 14a, the second apertures 22a may not directly overlap the first aperture 14a. Thus, after passing the first aperture 14a, the electron beam may be deflected, e.g., a beam axis of the electron beam may be changed, to pass through the second apertures 22a. However, a degree, e.g., an angle, of the change may not be so great to cause a quality of the electron beam to be degenerated. If, instead, one of the second apertures 22 is selected for the electron beam to pass through after passing the first aperture 12a, no change of the beam axis may result.

A plurality of first exposure patterns 40a may be formed in a first region of the blank reticle 32 after the electron beam passes the first aperture 14a and the second aperture 22a for the first pattern.

The second aperture plate 20 may be rotated so that a second aperture (not shown) for a second pattern may be positioned such that an electron beam having penetrated the first aperture 14a may pass through the second aperture 22a. By a method substantially the same as that used to generate the first exposure patterns 40a, a plurality of second exposure patterns (not shown) may be formed in a second region of the blank reticle 32.

The second aperture plate 20 may be rotated so that a third aperture (not shown) for a third pattern may be positioned such that an electron beam having penetrated the first aperture 14a may pass through the third aperture. By a method substantially the same as that used to generate the first exposure patterns 40a, a plurality of second exposure patterns (not shown) having irregular shapes may be formed in a third region of the blank reticle 32.

A photosensitive film (not shown) of the blank reticle 32 may be developed to form first, second and third masks. A blackout film (not shown) may be etched using the masks as an etching mask to form the first, second and third patterns for forming circuit. Thus, the reticle including the patterns on the base plate may be formed.

As discussed above, even though the beam axis may be changed, the quality of the electron beam may not be degenerated because the change of the beam axis may not be so great.

Figure 9:
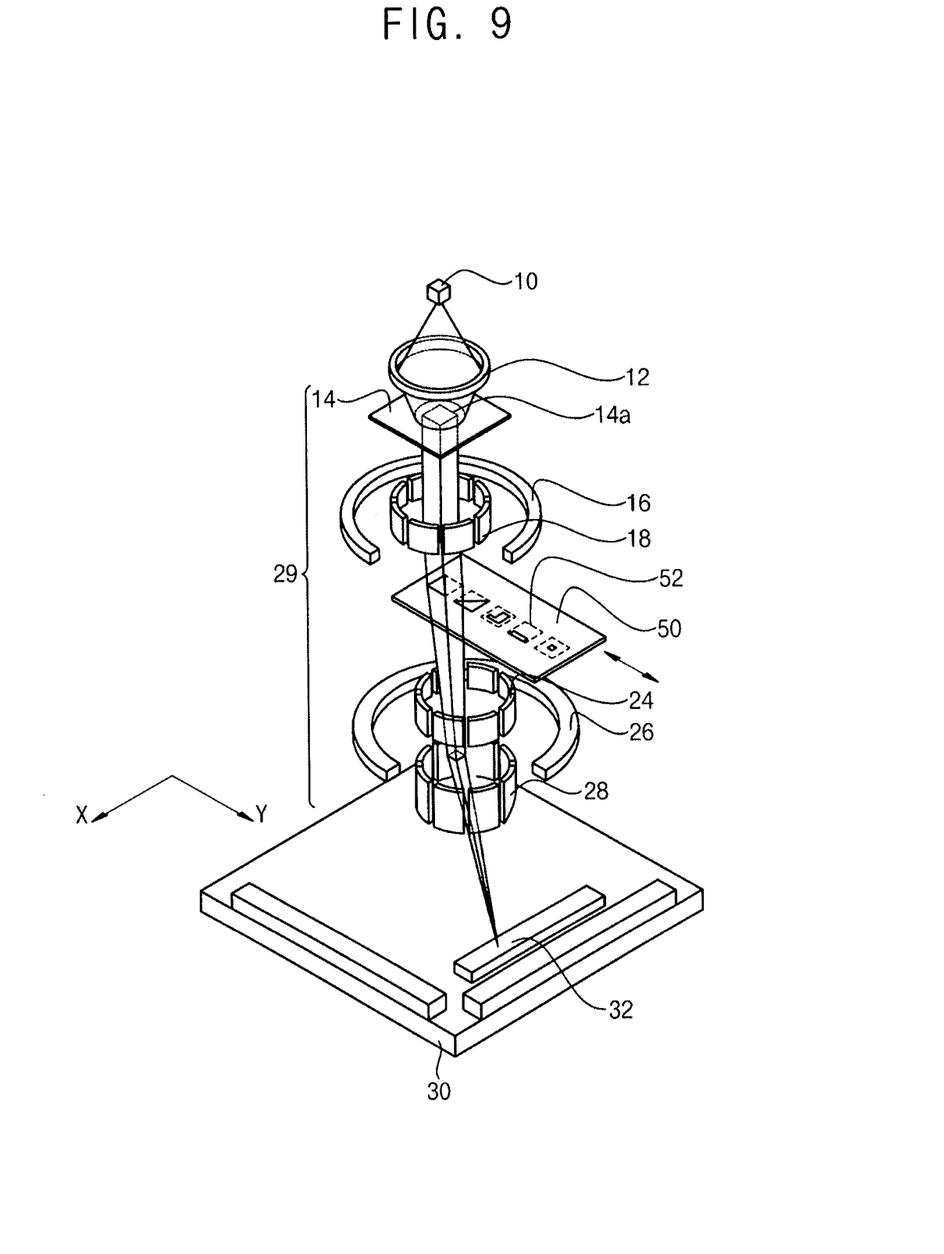
FIG. 9 illustrates an exposure apparatus for forming the reticle in accordance with example embodiments.

FIG. 9 illustrates an exposure apparatus for forming a reticle in accordance with example embodiments.

The exposure apparatus may be substantially the same as that of FIG. 1, except that a second aperture plate may be moved in a straight line, instead of rotated, and that the second aperture plate may have a rectangular shape in which second apertures may be arranged in a straight line.

Referring to FIG. 9, a second aperture plate 50 may have various types of second apertures 52. The second apertures 52 may be arranged in any suitable manner, e.g., in a straight line. The second apertures 52 may be arranged in a single line or in a plurality of lines.

A plate holder (not shown) may support the second aperture plate 50, and may be connected to a driving motor (not shown) and a control part (not shown). The driving motor may drive the plate holder in a straight line.

The plate holder may drive the second aperture plate 50 so that one of the second apertures 52 may directly overlap a first aperture 14*a*. Thus, the electron beam may pass the first aperture 14*a* and one of the second apertures 52 with no change of the beam axis thereof.

Figure 10:
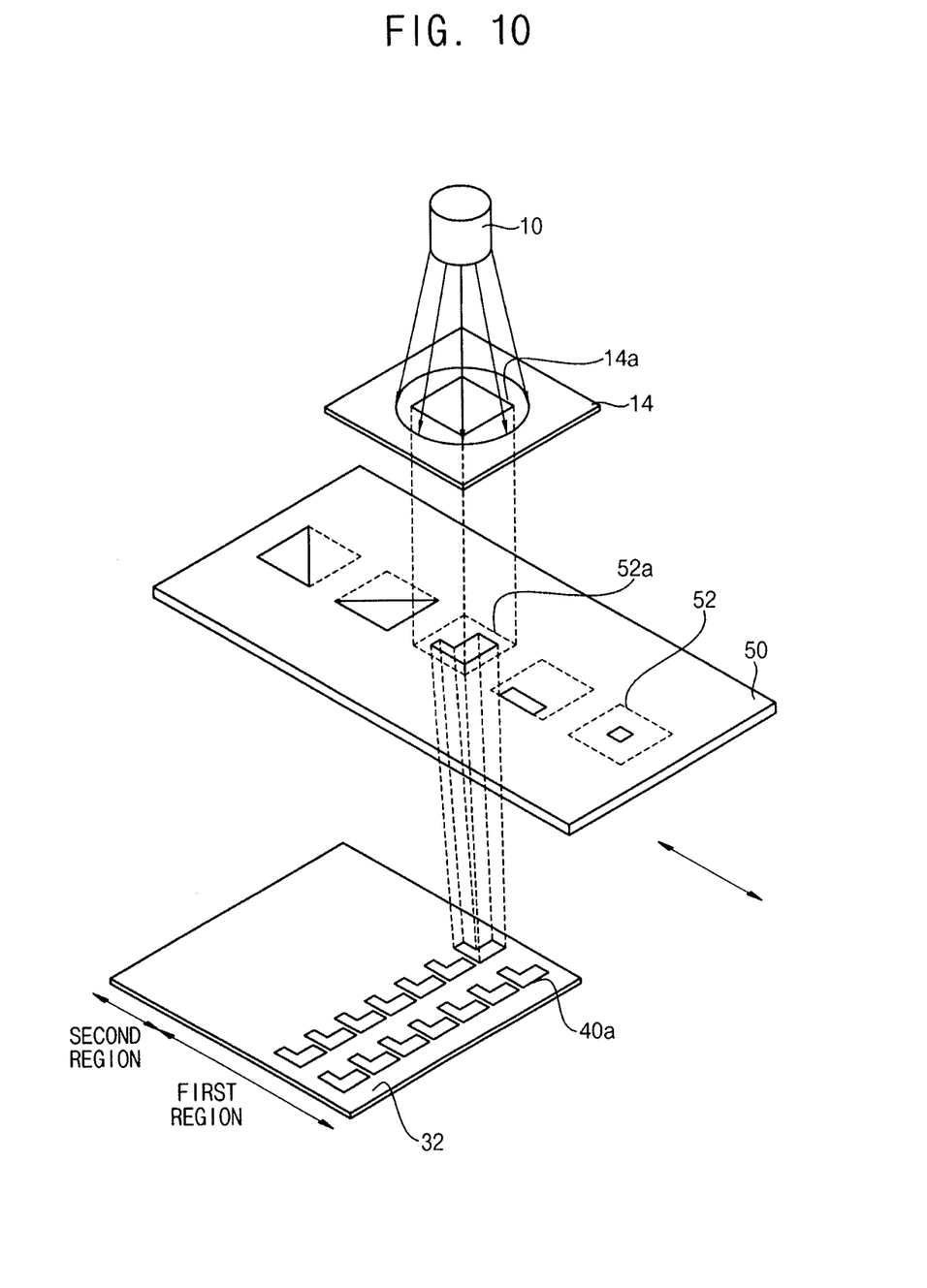
FIG. 10 illustrates a perspective view of stages in a method of forming a reticle in accordance with example embodiments.

FIG. 10 illustrates a perspective view of stages in a method of forming a reticle in accordance with example embodiments.

The method may be substantially the same as that of FIGS. 1 to 7, except that a second aperture plate may move in a straight line.

Referring to FIG. 10, the second aperture plate 50 may be moved in a straight line so that a second aperture 52*a* may directly overlap a first aperture 14*a*. A blank reticle 32 may be exposed by the electron beam that passes the first aperture 14*a* and the second aperture 52*a*. The blank reticle 32 may be moved so that a plurality of exposure patterns 40*a* may be formed in the blank reticle 32, e.g., in different positions of the blank reticle 32.

The exposure process may be repeatedly performed to form a plurality of second exposure patterns (not shown), and further to form a plurality of third exposure patterns (not shown) having irregular shapes. In example embodiments, the beam axis may be changed slightly so that the quality of the beam may not be degenerated. After the exposure process, a developing process and etching process may be performed to form the reticle having patterns therein.

Figure 11:
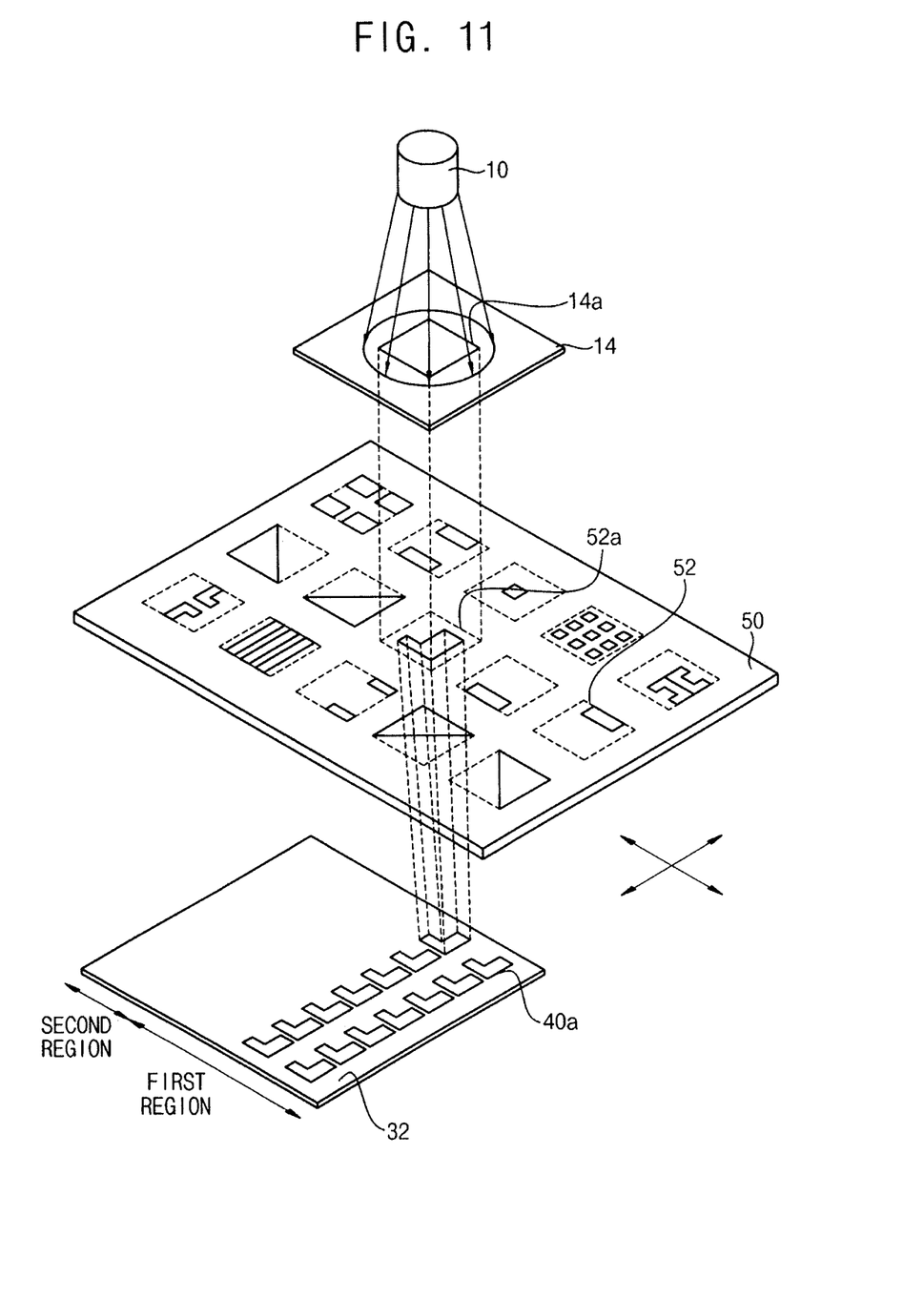
FIG. 11 illustrates a perspective view of stages in a method of forming a reticle in accordance with example embodiments.

FIG. 11 illustrates a perspective view of stages in a method of forming a reticle in accordance with example embodiments.

The method may be substantially the same as that of FIGS. 1 to 7, except that a second aperture plate may move in a plane, e.g., within a plane in which the second aperture plate lies.

Referring to FIG. 11, a second aperture plate 50 may be moved in a plane so that a second aperture 52*a* may directly overlap a first aperture 14*a*. A blank reticle 32 may be exposed by the electron beam that passes the first aperture 14*a* and the second aperture 52*a*. The blank reticle 32 may be moved so that a plurality of exposure patterns 40*a* may be formed in the blank reticle 32, e.g., in different positions of the blank reticle.

The exposure process may be repeatedly performed to form a plurality of second exposure patterns (not shown), and further to form a plurality of third exposure patterns (not shown) having irregular shapes. In example embodiments, the beam axis may be changed slightly so that the quality of the beam may not be degenerated. After the exposure process, a developing process and etching process may be performed to form the reticle having patterns therein.

The exposure apparatus for forming a reticle, according to the embodiments, may have high efficiency for forming the reticle. One or more embodiments may provide a method of forming a reticle using the exposure apparatus for forming the reticle. According to example embodiments, when forming various types of patterns using an exposure apparatus, an electron beam may not be deflected by moving a second aperture plate. Additionally, various types of apertures in the second aperture plate may be used for forming various types of patterns. Thus, the amount and time of exposure may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a reticle, the method comprising:
    loading a blank reticle;
    projecting an electron beam;
    moving a second aperture plate having a first pattern aperture and a second pattern aperture so that the first pattern aperture is directly overlapped by a first aperture of a first aperture plate, the electron beam passing through the first pattern aperture after passing the first aperture;
    exposing the blank reticle with the electron beam after the electron beam passes the first pattern aperture, to form a first exposure pattern;
    moving the second aperture plate so that the second pattern aperture is directly overlapped by the first aperture of the first aperture plate, the electron beam passing through the second pattern aperture after passing the first aperture;
    exposing the blank reticle with the electron beam after the electron beam passes the second pattern aperture, to form a second exposure pattern; and
    developing the blank reticle having the first and second exposure patterns to form the reticle having first and second patterns.

2. The method as claimed in claim 1, wherein the blank reticle includes a base plate, a blackout film and a photosensitive film sequentially stacked.

3. The method as claimed in claim 2, wherein exposing the blank reticle includes exposing the photosensitive film, and developing the blank reticle includes developing the photosensitive film.

4. The method as claimed in claim 3, wherein developing the blank reticle includes forming first and second masks in the photosensitive film.

5. The method as claimed in claim 4, further comprising etching the blackout film using the first and second masks as an etching mask to form the first and second patterns.

6. The method as claimed in claim 1, wherein the second aperture plate includes a plurality of pattern apertures, each of the pattern apertures having different shapes.

7. The method as claimed in claim 6, wherein the second aperture plate is moved by rotation.

8. The method as claimed in claim 7, wherein the plurality of pattern apertures are substantially a same distance from a center of the second aperture plate.

9. The method as claimed in claim 1, wherein each of the first and second exposure patterns is formed by one shot.

10. The method as claimed in claim 1, further comprising:
moving the second aperture plate so that a third pattern aperture in the second aperture plate is directly overlapped by the first aperture, a portion of the electron beam passing through the third pattern aperture after passing the first aperture; and
exposing the blank reticle using the electron beam after the electron beam passes the third pattern aperture, to form a plurality of third exposure patterns having irregular shapes.

11. A method of forming a reticle, the method comprising:
loading a blank reticle;
projecting an electron beam toward the blank reticle;
passing a first portion of the electron beam through a first aperture plate having a first aperture and a second aperture plate having a first pattern aperture and a second pattern aperture, by aligning the first pattern aperture with the first aperture;
exposing the blank reticle after the first portion of the electron beam passes the first pattern aperture, to form a first exposure pattern;
passing a second portion of the electron beam through the first aperture plate and the second aperture plate, by aligning the second pattern aperture with the first aperture;
exposing the blank reticle after the second portion of the electron beam passes the second pattern aperture, to form a second exposure pattern; and
developing the blank reticle having the first and second exposure patterns to form the reticle having first and second patterns.

12. The method as claimed in claim 11, wherein the second aperture plate is rectangular.

13. The method as claimed in claim 12, wherein the first pattern aperture and the second pattern aperture are arranged in a single line.

14. The method as claimed in claim 11, wherein the second aperture plate is circular.

15. The method as claimed in claim 14, wherein the first pattern aperture and the second pattern aperture are arranged in a circle.

* * * * *